United States Patent [19]

Masaie et al.

[11] 4,196,407
[45] Apr. 1, 1980

[54] PIEZOELECTRIC CERAMIC FILTER

[75] Inventors: Kimio Masaie, Hakui; Yoshio Murata, Ishikawa, both of Japan

[73] Assignee: Murata Manufacturing Co., Ltd., Japan

[21] Appl. No.: 962,904

[22] Filed: Nov. 22, 1978

[30] Foreign Application Priority Data

Dec. 26, 1977 [JP] Japan .................................. 52-160802

[51] Int. Cl.² ........................ H03H 9/26; H03H 9/32; H03H 9/06
[52] U.S. Cl. .................................... 333/191; 310/326; 310/366
[58] Field of Search ............................... 333/187–192; 310/320, 321, 328–331, 365, 366, 326, 327

[56] References Cited

U.S. PATENT DOCUMENTS

| 3,633,134 | 1/1972 | Barrows et al. | 333/192 |
| 3,676,724 | 7/1972 | Berlincourt et al. | 333/191 |
| 3,727,154 | 4/1973 | Dailing et al. | 333/191 |

Primary Examiner—Alfred E. Smith
Assistant Examiner—Marvin Nussbaum

[57] ABSTRACT

A piezoelectric ceramic multiple mode filter exploiting the energy trapping theory, wherein the resistance between the ground electrode and the electrode for external connection is between several ohms and several tens of ohms. In a preferred embodiment, the connection lead between the ground electrode and the electrode for external connection is designed to provide the necessary resistance.

7 Claims, 4 Drawing Figures

PIEZOELECTRIC CERAMIC FILTER

BACKGROUND OF THE INVENTION

1. Field of the Invention

The present invention relates to a piezoelectric ceramic filter. More specifically, the present invention relates to a multiple-mode piezoelectric ceramic filter employing the principle of energy trapping.

2. Description of the Prior Art

A piezoelectric ceramic multiple mode filter utilizing a piezoelectric ceramic plate made of such a material as lead titanate zirconate and employing the energy trapping theory has been put into wide practical use.

The energy trapping theory was proposed in 1963 by Dr. W. Shockley. First the energy trapping theory will be briefly sketched. Consider a piezoelectric ceramic plate extending in the X-Z plane of an X-Y-Z Cartesian coordinate system and having a thickness in the Y axis direction, and an electromagnetic wave propagating in the Z axis direction along the piezoelectric ceramic plate. For simplicity, let it be assumed that the piezoelectric ceramic plate is of infinite length in the X axis direction and the electric displacement vector points in the X axis direction. In such a situation the polarization direction is entirely in the X axis. If electrical boundary conditions are neglected for simplicity, a solution for the X component of the displacement vector D (the other components being zero), satisfying the boundary conditions that D vanishes at the upper and lower surfaces of the piezoelectric ceramic plate, may be expressed as follows:

$$D = A \cos(n\pi y/T) \exp j(\omega t + \beta z)$$

where A is a constant, T is the thickness of the piezoelectric ceramic plate, $\omega$ is the angular frequency of the incident wave, $\beta$ is the propagation constant in the Z axis direction, t is time, n is an integer, and j is the principal square root of $-1$. The propagation constant $\beta$ in the Z axis direction may be expressed by the following equation:

$$\beta = \frac{n\pi}{T} \sqrt{\left(\frac{f}{nf_0'}\right)^2 - 1}$$

where $f_0'$ is the fundamental frequency of a thickness shear vibration, the piezoelectric ceramic plate being infinitely broad, f is the frequency of the wave, and n is the number of the order of the harmonics. In the case of the fundamental vibration, i.e. where n=1, when f is greater than then the propagation constant $\beta$ is a real number constant, and when f is less than then the propagation constant $\beta$ is a pure imaginary number. Therefore, the frequency $f_0'$ is the cut off frequency of the wave propagating in the Z axis direction. This means that a wave of frequency higher than the cut-off frequency $f_0'$ can propagate freely while a wave of frequency lower than the cut-off frequency $f_0'$ cannot propagate any appreciable distance because the magnitude of the electric displacement decreases exponentially.

If the major surfaces of the piezoelectric ceramic plate are each completely covered with an electrode, the fundamental inherent frequency of the thickness shear vibration decreases by virtue of the added weight and of the piezoelectric reaction of the electrodes from $f_0'$ to a frequency $f_0$. Assuming that part of each electrode is removed through an etching process such that only a portion is left, then the frequency f in the electrode region has value intermediate the frequencies $f_0$ and $f_0'$. If the electrode region is excited at the frequency f, the vibration energy in that region is confined or trapped in the electrode and cannot propagating outward, became the cut off frequency in the region not covered by the electrode is $f_0'$ which is higher than the excitation frequency f. Since the vibration amplitude decreases in an exponential manner as the distance from the edge of the electrodes increases, little vibration occurs at appreciable distances from the edge of the electrode region. Even if two or more resonators are disposed on the same piezoelectric ceramic plate at a certain distance from each other, very little interference will occur between them, with the result that each can be used as an independent resonator. The above described principle is referred to as the energy trapping theory.

Thus it has been observed on the basis of the energy trapping theory that the provision of a pair of small electrodes on a piezoelectric ceramic plate provides a resonator of less spurious. If one of such a pair of electrodes is split in two at its center, then two different modes of frequency resonance energy, with a different phase relation of the vibration are trapped simultaneously. One mode of vibration is referred to as a symmetrical mode and exhibits a vibration amplitude distribution wherein the vibration amplitude of each part of the split electrode is the same. The other mode of vibration is referred to as an anti-symmetrical mode and exhibits a distribution of the vibration amplitude wherein the vibration amplitude of each of the split electrodes is 180° out of phase with the other. Thus, a multiple mode filter is provided, based on the energy trapping theory, in the split electrode region. In a multiple mode filter two resonators are provided on a single piezoelectric ceramic plate, and two modes of vibration energy are confined or trapped simultaneously. As a result, substantially the same effect as with a filter including a phase inverting transformer can be achieved.

A typical prior art piezoelectric ceramic multiple mode filter employing the energy trapping theory comprises electrode film of an electrode material having high conductivity, such as Ag, Cu, or the like, formed by means of an evaporation or a firing process on a piezoelectric ceramic plate made of such a material as lead titanate zirconate. Since the electrode material is of high conductivity its direct current resistance can be taken as is very small and approximately zero ohm. Therefore, it has been observed that since the quality factor $Q_m$ of the piezoelectric ceramic plate is high, the phase linearity deteriorates, which is important when the filter is utilized in an FM radio receiver. In addition, in the case where a plurality of filters of such type are capacitively coupled in a cascade various disadvantages can result: for example, an overall characteristic such as a group delay characteristic curve becomes uneven in the pass band and becomes unstable by virtue of the mutual coupling of the filters, adverse effects are exerted upon both the amplitude and the phase characteristics, and the like. FIG. 1 is a graph showing the frequency characteristic of such capacitively coupled filters, wherein the abscissa indicates the frequency, the left ordinate indicates the attenuation and the right ordinate indicates the group delay time, curve a showing the amplitude characteristic and curve b showing the group delay time. If for various reasons the anti-symmetrical mode energy is much less than the symmetrical mode energy, the above described adverse effect in the group delay characteristic is aggravated for frequencies lower than the central frequency of the pass band, as seen in FIG. 1.

SUMMARY OF THE INVENTION

Briefly described, the present invention comprises a piezoelectric ceramic multiple mode filter employing the energy trapping theory, characterized in that the resistance between the ground electrode and the electrode for external connection has a value of from several ohms to several tens of ohms. In one preferred embodiment, a lead connecting the ground electrode and the electrode for external connection is made to have such a resistance value. Alternatively, the above described necessary resistance may be contributed by the ground electrode, the electrode for external connection and the lead connecting them. Alternatively, such necessary resistance may be attained by an inherent resistance of the ground or of the external connection electrode.

According to the present invention, the symmetrical mode resonance is strongly damped by the above described resistance, while the anti-symmetrical mode resonance is less or not at all, whereby the phase linearity and thus the group delay characteristic are improved.

Accordingly, a principal object of the present invention is to provide an improved piezoelectric ceramic multiple mode filter employing the energy trapping theory, wherein a symmetrical mode resonance is strongly damped while an anti-symmetrical mode resonance is damped less or not at all.

Another object of the present invention is to provide a piezoelectric ceramic multiple mode filter employing the energy trapping theory, wherein the group delay characteristic curve is flat in the pass band when a plurality of such filters are capacitively coupled in cascade.

A further object of the present invention is to provide a piezoelectric ceramic multiple mode filter employing the energy trapping theory, with improved the phase linearity.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
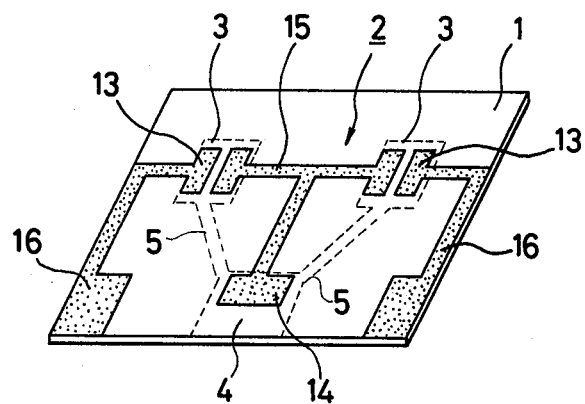
FIG. 2 shows a perspective view of one embodiment of the piezoelectric ceramic multiple mode filter of the present invention.

Referring to FIG. 2, there is shown a perspective view of one embodiment of the piezoelectric ceramic multiple mode filter of the present invention. A piezoelectric ceramic plate 1 is made of lead titanate zirconate, for example, and is approximately 200μ thick. An electrode pattern 2 is formed as shown on the piezoelectric ceramic plate in accordance with a conventional process. For example, a thin conductive film can be evaporated onto the whole upper and lower surfaces of the piezoelectric ceramic plate 1 and all but the portion forming the desired electrode pattern 2 removed by an etching process.

The filter of the embodiment shown comprises a general structure wherein two energy trapping type multiple mode filters are formed on a single piezoelectric ceramic plate such that the two filters are coupled through a parallel electrostatic capacitance to achieve a cascade connection. The geometry of the piezoelectric ceramic plate 1 and the geometry of the electrode pattern 2 are well known to those skilled in the art. More detailed description of such piezoelectric ceramic multiple mode filter employing the energy trapping theory is to be found in U.S. Pat. No. 3,676,724, issued July 11, 1972 to Berlincourt et al. and entitled "Multi-Element Piezoelectric Circuit Component", and is incorporated herein by reference.

The electrode pattern 2 comprises, on the lower surface, ground electrodes 3, an electrode 4 for external connection, and lead connections 5. The electrode pattern 2 comprises, on the upper surface, split electrodes 13 facing the ground electrodes portions 3, a capacitor electrode 14 facing the external connection electrode 4 to form a capacitor, a lead 15 connecting portions 13 and 14, and electrode portions 16 for external connection. The electrodes 3, 4 and 5 may be made of a Cu–Ni alloy such as monel metal of proper ingredient proportion. On the other hand, the electrode portions 13, 14, 15 and 16 on the upper surface of the piezoelectric ceramic plate 1 may be formed of a material having high conductivity such as Ag, Cu or the like. The electrode pattern 2 may be formed in accordance with a conventional process, as described previously. The lower surface electrode portions 3, 4 and 5 may be of substantially the same thickness as the upper surface electrode portions 13, 14, 15 and 16, perhaps approximately 1μ thick. According to the present invention, however, the lead portions 5 preferable have a resistance of from several ohms to several tens of ohms. Such a resistance in the lead portions 5 can be achieved by proper selection of the thickness of the electrode film, and of the length, the width and the material of the lead portions 5.

Figure 3:
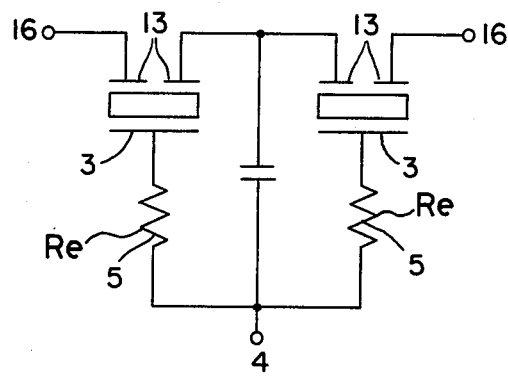
FIG. 3 is an equivalent circuit of one embodiment of the present invention.

FIG. 3 shows an equivalent circuit of the filter shown in FIG. 2. As readily seen from the equivalent circuit shown in FIG. 3, the symmetrical mode resonance is strongly damped while the anti-symmetrical mode resonance is only weakly damped.

Figure 4:
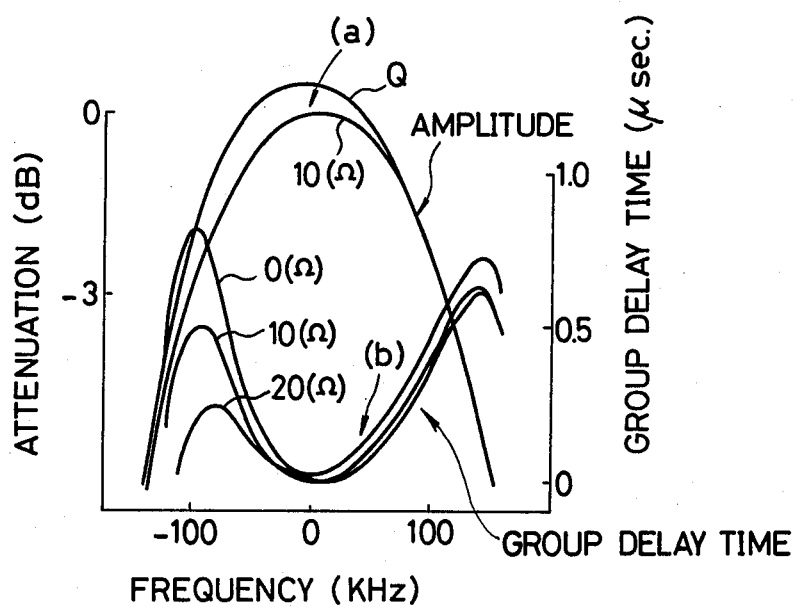
FIG. 4 is a graph showing the frequency characteristics in the pass band of one embodiment of the present invention.

FIG. 4 is a graph showing the frequency characteristics of the filter of the present invention, wherein the abscissa indicates the frequency, the left ordinate indicates the attenuation and the right ordinate indicates the group delay time, curves a showing the amplitude characteristic and curves b showing the group delay time, with various resistance values as a parameter. From FIG. 4, it is readily seen that the greater the resistance Re of the lead portions 5, the flatter the group delay time characteristic curves become, although the the insertion loss increases with Re. Thus, it will be appreciated that the details of the design of the filter of the invention should be chosen in consideration of the purpose to which the filter will be put, etc.

It is pointed out that the present invention should be not limited to the embodiment shown. For example, the present invention is applicable to a filter having a single split electrode region or three or more split electrode regions, and is not limited to a filter having two split electrode regions.

The region contributing the required resistance of from several ohms to several tens ohms may be any portion between the ground electrode 3 and the external connection electrode 4. More specifically, the resistance may be contributed entirely by the ground electrode 3, entirely the lead portions 5, or entirely by the external connection electrode 4, or alternatively by any two of them, as long as the total necessary resistance is provided. If the electrodes are produced by means of a conventional electrode forming process, such as evaporation, etching, or the like, it is efficient for the necessary resistance to be distributed over the whole electrode pattern. However, one portion of the electrode pattern may be applied with a resistor paste or the like, while the remaining portion is formed with a silber paste. Generally, this type of filter is very small, and hence the electrodes are small and the leads are extremely short. Therefore, in order to provide the necessary resistance, it is necessary to select appropriate values for the thickness of the electrode film, the width of the electrodes, the material, and the like. However, since it is especially easy to control the thickness or the width of the lead portions of the electrode film. It is advisable to provide the necessary resistance by selection of the geometry and the material of the lead portions.

Figure 1:
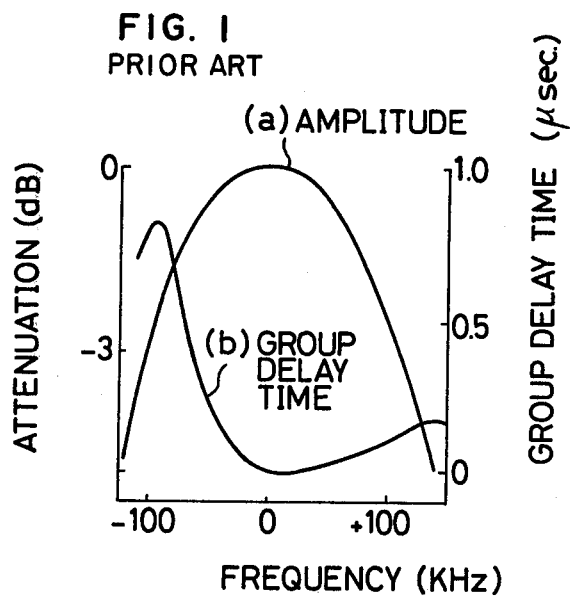
FIG. 1 is a graph showing the frequency characteristic in the pass band of the conventional piezoelectric ceramic multiple mode filter.

As is clear from the foregoing description, the present invention is characterized by the provision of a resistance of from several of ohms to several tens ohms between the ground electrode 3 and the external connection electrode 4. As is well known, the frequency characteristics of the ceramic filter depend on the degree of polarization of the piezoelectric ceramic plate, the electrode pattern, the geometry of the plate and the electrode pattern, and the like. Therefore, in designing the piezoelectric ceramic filter of the invention, first a filter of the same structure but with the electrode on its lower surface made of material having a high conductivity, such as Ag or the like, is prepared, so that the resistance of the lead portion 5 between the ground electrode 3 and the external connection electrode 4 is negligible, and the material of the piezoelectric ceramic plate, the electrical and mechanical coupling coefficients, the geometry of the electrode pattern, etc. are selected so as to achieve the group delay time characteristic shown in FIG. 1. The resistance between the ground electrode 3 and the external connection electrode 4 on the lower surface is then so selected as to achieve a flat group delay time characterstic.

By way of another embodiment of the present invention, the whole electrode pattern on both the upper and the lower surfaces of the piezoelectric ceramic plate 1 may be formed of a metal having a suitably relatively high resistivity, to improve the group delay charactersitic. However, in view of the insertion loss it is preferable that the above described resistance should be provided in the portion between the ground electrode 3 and the external connection electrode 4 on the lower surface.

Although preferred embodiments of the present invention have been described and illustrated in detail, it is clearly understood that these are by way of illustration and example only and are not to be taken by way of limitation, the spirit and scope of the present invention being limited only by the terms of the appended claims.

What is claimed is:

1. A piezoelectric ceramic multiple mode filter, comprising:
   a thin wafer of a piezoelectric ceramic material having first and second parallel major surfaces;
   a plurality of spaced electrodes formed on said first major surface of said wafer;
   conductor means formed on said second major surface of said wafer, said conductor means including counter-electrode means located in opposition to said spaced electrodes;
   said spaced electrodes and said counter-electrode means coacting with the portion of said piezoelectric ceramic material located between said spaced electrodes and said counter electrode means to form resonator elements having several modes of resonance, the vibrations of one of said modes of resonance being symmetrical with respect to said spaced electrodes and the vibrations of the other of said modes of resonance being anti-symmetrical with respect to said spaced electrodes, and
   said conductor means further including connecting means coupled to said counter-electrode means and located on said second major surface of said wafer for external electrical connection,
   one portion of said conductor means having a resistance for damping said symmetrical mode of resonance.

2. A piezoelectric ceramic multiple mode filter in accordance with claim 1, wherein said connecting means comprises an external connection terminal and a lead conductor electrically connecting said counter electrode means and said external connection terminal.

3. A piezoelectric ceramic multiple mode filter in accordance with claim 2, wherein said lead conductor has such a geometry as to provide said resistance for damping.

4. A piezoelectric ceramic multiple mode filter in accordance with claim 2, wherein said counter electrode means, said lead conductor and said external connection terminal have such a geometry as to provide such resistance for damping.

5. A piezoelectric ceramic multiple mode filter in accordance with claim 1, wherein said conductor means is made of a material with high enough a resistivity to provide said resistance for damping.

6. A piezoelectric ceramic multiple mode filter in accordance with claim 1, wherein said spaced electrodes are designed to have sufficient resistance to damp said anti-symmetrical mode of resonance.

7. A piezoelectric ceramic multiple mode filter in accordance with claim 1, which further comprises further connecting means coupled to said spaced electrodes and provided on said first major surface of said wafer, said further connecting means being designed to have a resistance sufficient to damp said anti-symmetrical mode of resonance.

* * * * *